(12) United States Patent
Fragapane

(10) Patent No.: US 6,169,300 B1
(45) Date of Patent: *Jan. 2, 2001

(54) INSULATED GATE BIPOLAR TRANSISTOR WITH HIGH DYNAMIC RUGGEDNESS

(75) Inventor: Leonardo Fragapane, Catania (IT)

(73) Assignee: SGS-Thomson Microelectronics S.r.l., Agrate Brianza (IT)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/034,391

(22) Filed: Mar. 4, 1998

(30) Foreign Application Priority Data

Mar. 11, 1997 (EP) .................................. 97830108

(51) Int. Cl.$^7$ .................................. H01L 29/74
(52) U.S. Cl. .................. 257/146; 257/140; 257/341; 257/378
(58) Field of Search .................. 257/331, 341, 257/140, 146, 370, 378, 350, 577; 438/138, 140

(56) References Cited

U.S. PATENT DOCUMENTS

| | | | |
|---|---|---|---|
| 4,630,084 | * 12/1986 | Tihanyi | 257/341 |
| 4,644,637 | 2/1987 | Temple | 438/138 |
| 4,801,986 | 1/1989 | Chang et al. | 257/139 |
| 5,136,349 | * 8/1992 | Yilmaz et al. | 257/339 |
| 5,451,531 | * 9/1995 | Yamaguchi et al. | 438/138 |
| 5,559,347 | * 9/1996 | Yamazaki et al. | 257/139 |
| 5,559,355 | * 9/1996 | Yamazaki et al. | 257/341 |
| 5,621,234 | * 4/1997 | Kato | 257/339 |

FOREIGN PATENT DOCUMENTS

| | | | |
|---|---|---|---|
| 0 132 861 | 2/1985 | (EP) | H01L 29/78 |
| 536 668 | 4/1993 | (EP) | H01L 29/78 |
| 2 575 334 | 6/1986 | (FR) | H01L 29/78 |
| 2 641 417 | 7/1990 | (FR) | H01L 29/68 |
| 4-132264 | * 5/1992 | (JP) | 257/341 |

OTHER PUBLICATIONS

European Search Report from European Patent Application 97830108.3. filed Mar. 11, 1997.
Patent Abstracts of Japan, vol. 012, No. 425 (E–681), Jul. 07, 1988 & JP–A–63 164473 (Fujitsu Ltd.)

* cited by examiner

*Primary Examiner*—Mahshid Saadat
*Assistant Examiner*—George C. Eckert, II
(74) *Attorney, Agent, or Firm*—Wolf, Greenfield & Sacks, P.C.; James H. Morris; Theodore E. Galanthay

(57) ABSTRACT

An Insulated Gate Bipolar Transistor includes a semiconductor substrate of a first conductivity type forming a first electrode of the device, a semiconductor layer of a second conductivity type superimposed over said substrate, a plurality of body regions of the first conductivity type formed in the semiconductor layer, a first doped region of the second conductivity type formed inside each body region, an insulated gate layer superimposed over portions of the semiconductor layer between the body regions and forming a control electrode of the device, a conductive layer insulatively disposed over the insulated gate layer and contacting each body region and each doped region formed therein, the conductive layer forming a second electrode of the device. In the portions of the semiconductor layer between the body regions second doped regions of the first conductivity type are formed, and openings are provided in the insulated gate layer at the second doped regions to allow the conductive layer to contact the second doped regions.

24 Claims, 3 Drawing Sheets

INSULATED GATE BIPOLAR TRANSISTOR WITH HIGH DYNAMIC RUGGEDNESS

BACKGROUND OF THE INVENTION

1. Field of the Invention

The present invention relates to an Insulated Gate Bipolar Transistor with a high dynamic ruggedness.

2. Discussion of the Related Art

Known Insulated Gate Bipolar Transistors (IGBTs) include a heavily doped semiconductor substrate of a first conductivity type, for example of the P type, forming the collector of the device, over which a lightly doped semiconductor layer of the opposite conductivity type (N type) is formed. Inside the N type layer a plurality of elementary vertical MOSFETs is formed, each including a P type body region and an N type emitter region formed therein.

The IGBT is thus a four-layer device, and associated therewith is a thyristor. The most important feature of IGBTs over power MOSFETs is the low output resistance, which is achieved thanks to the conductivity modulation of the lightly doped N type layer by means of the injection therein of minority carriers from the P type substrate. Conventionally, the performance of an IGBT is measured by four electrical parameters: the collector-to-emitter saturation voltage ($V_{CESAT}$), which is directly related to the output resistance and provides a measure of the energy dissipated by the IGBT in on state, the breakdown voltage between collector and emitter ($BV_{CES}$), the latching current ($I_{latch}$), and the fall-time when the device is switched off ($t_{fall}$), which provides a measure of the energy dissipated by the IGBT when switched off.

The optimization of a generic one of said parameters generally leads to the degradation of one or more of the others. For example, trying to improve $t_{fall}$ and $I_{latch}$ causes a significant increase of $V_{CESAT}$. In fact, it has been verified that notwithstanding the conductivity modulation effect of the lightly doped N type layer, the voltage drop caused by the so-called JFET component of the output resistance is substantial. This is due to the fact that not all of the minority carriers injected into the lightly doped N type layer from the substrate reach the surface of the device, some of them recombining in the lightly doped N type layer before they reach the surface thereof. For example, in a device with an N type layer 60 um thick and having a dopant concentration of 1E14 atoms/cm3, thanks to the conductivity modulation effect the dopant concentration in the N type layer at the junction with the substrate is approximately 1E16 atoms/cm3 but only of 1E15 atoms/cm3 at the top surface of the N type layer.

To improve $BV_{CES}$ and $I_{latch}$, the distance between the elementary vertical MOSFETs forming the IGBT (i.e., the distance between the body regions) should be reduced. However, this would cause a substantial increase of the JFET component of the output resistance. On the contrary, increasing the distance between the body regions would reduce the JFET component of the output resistance, but at the cost of a degradation of $BV_{CES}$ and $I_{latch}$.

A low value of $I_{latch}$ means that the device is easily subject to latch-up. Latch-up can most easily occur during switching: the voltage drop across the base and emitter of the parasitic NPN transistor, caused by the hole current flowing in the body region under the emitter region, turns the parasitic NPN transistor on, thus triggering the parasitic thyristor on. The voltage drop across the emitter and base of the NPN parasitic transistor depends on the resistance of the body region under the emitter region, and on the current of holes which, injected into the N type layer from the substrate, are collected by the body region of the IGBT. Triggering on of the parasitic thyristor can also lead to the destruction of the IGBT.

In view of the state of the art described, it is an object of the present invention to provide an IGBT structure having a high ruggedness, i.e. a high $I_{latch}$ value even in switching conditions, that is achieved without deterioration of the other electrical parameters characterizing the performance of the device.

SUMMARY OF THE INVENTION

According to the present invention, this and other objects are achieved by means of an Insulated Gate Bipolar Transistor comprising a semiconductor substrate of a first conductivity type forming a first electrode of the device, a semiconductor layer of a second conductivity type superimposed over said substrate, a plurality of body regions of the first conductivity type, a first doped region of the second conductivity type formed inside each body region, an insulated gate layer superimposed over portions of the semiconductor layer between the body regions and forming a control electrode of the device, a conductive layer insulatively disposed over the insulated gate layer and contacting each body region and each doped region formed therein, the conductive layer forming a second electrode of the device, wherein in said portions of the semiconductor layer between the body regions, second doped regions of the first conductivity type are formed and openings are provided in the insulated gate layer at said second doped regions to allow the conductive layer to contact the second doped regions.

Thanks to the fact that said second doped regions of the first conductivity type are provided in the portions of the second conductivity type semiconductor layer between the body regions, and thanks to the fact that said second doped regions are electrically connected to the body regions and to the emitter regions of the IGBT, each elementary IGBT is shunted by a bipolar junction transistor (BJT) formed by the second doped region, the semiconductor layer and the substrate; such a BJT provides a current path parallel to that of the parasitic transistor formed by the first doped regions, the body regions and the semiconductor layer, thus subtracting current therefrom. The voltage drop across the base-emitter junction of said parasitic transistor is thus reduced, and the triggering point of the parasitic thyristor is elevated.

BRIEF DESCRIPTION OF THE DRAWINGS

These and other features of the present invention will be made apparent by the following detailed description of some particular embodiments thereof, illustrated as non-limiting examples in the annexed drawings, wherein.

DETAILED DESCRIPTION

Figure 1:
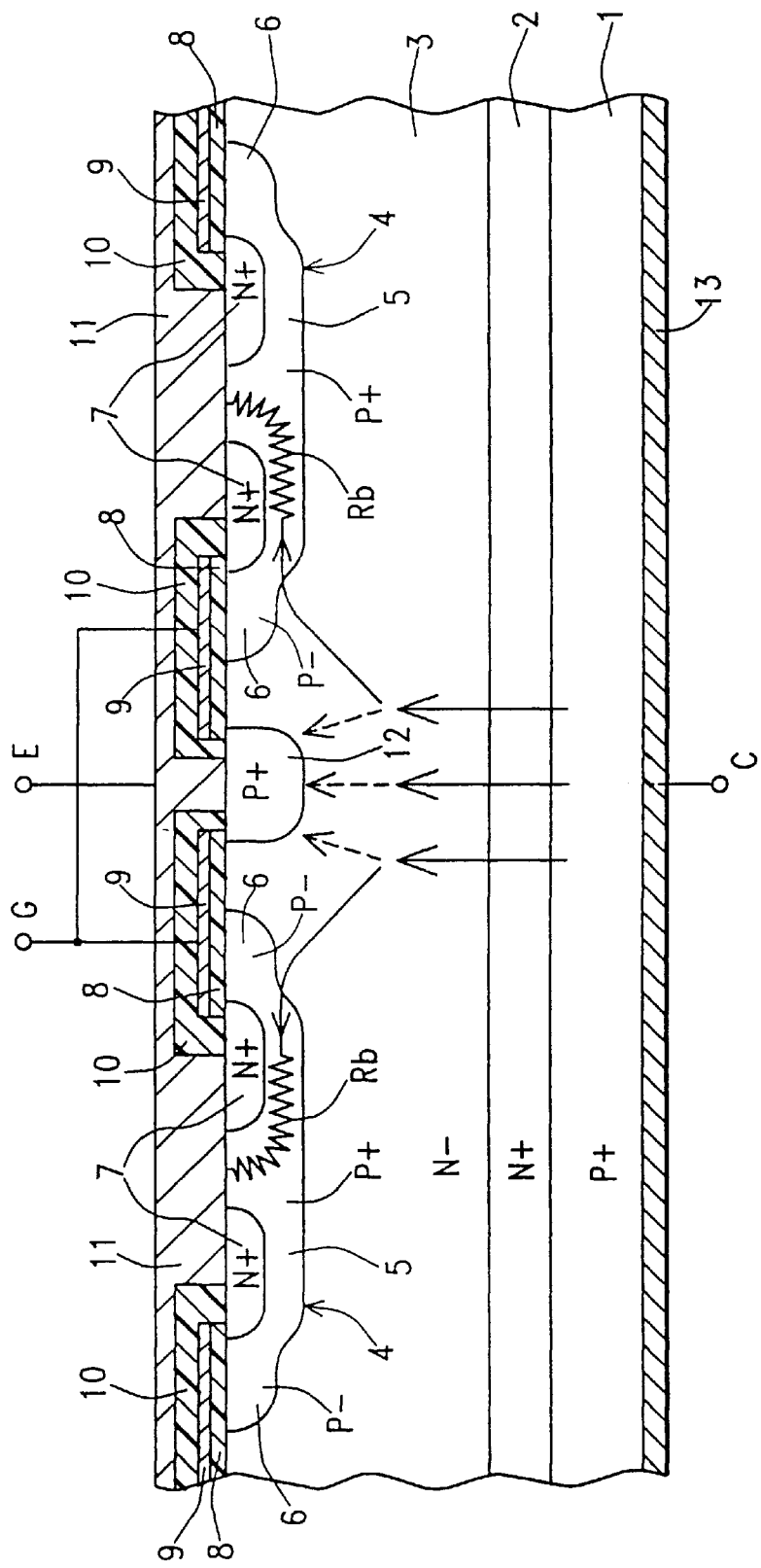
FIG. 1 is a cross-sectional view of a portion of an Insulated Gate Bipolar Transistor according to the present invention.

FIG. 1 shows a cross-sectional view of a portion of a Insulated Gate Bipolar Transistor according to the present invention. The device comprises a highly conductive semiconductor substrate 1 of a first conductivity type, which in the example corresponds to the P type; over the substrate 1 a highly conductive buffer layer 2 of the opposite conductivity type (N type in the example) is provided, and over the buffer layer 2 a lightly doped N type layer 3 is formed. Inside the N type layer 3 a plurality of P type body regions 4 is formed; each body region preferably comprises a central heavily doped portion 5 surrounded by a more lightly doped channel portion 6. Inside each body region 4 heavily doped N type emitter regions 7 are formed.

Over the surface of the N type layer 3 (the front surface of the device) an insulated gate layer is provided comprising a gate oxide layer 8 and a conductive gate layer 9, typically made of polysilicon. The insulated gate layer extends over the surface of the N type layer 3 between the body regions 4 and overlaps the channel portions 6 thereof. The insulated gate layer is covered by an insulating layer 10 wherein emitter contact openings are formed over the body regions 4 to allow for an emitter conductive layer 11 to contact the emitter regions 7 and the central portion 5 of each body region 4.

The emitter conductive layer 11 is connected to an emitter terminal E of the device; at the rear surface of the substrate 1 a collector conductive layer 13 is provided, which is connected to a collector electrode C. The conductive gate layer 9 is electrically connected to a gate terminal G of the IGBT.

The structure described up to now is per-se conventional.

According to the present invention, in the portions of the N type layer 3 between adjacent body regions 4 heavily doped P type regions 12 are formed; openings are provided in the insulated gate layer 8, 9 and in the overlying insulating layer 10 over the P type regions 12, so as to allow the emitter conductive layer 11 to contact the P type regions 12.

Figure 2:
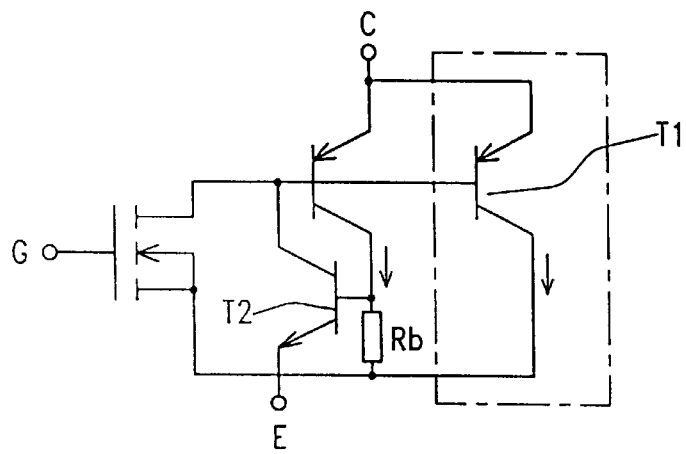
FIG. 2 is a electric circuit diagram equivalent to the Insulated Gate Bipolar Transistor of FIG. 1.

Thanks to the provision of the P type regions 12, electrically connected to the emitter regions 7 and to the central portions 5 of the body regions 4, a PNP bipolar junction transistor T1 (FIG. 2) formed by the regions 12, the N type layer 3 and the substrate 1 is provided in parallel to the collector and emitter electrodes C and E of the IGBT. Such a transistor T1 reduces the hole current in the body regions 4 under the emitter regions 7, so that the voltage drop across the resistance Rb is lowered; the base-emitter voltage of the parasitic transistor T2 formed by the emitter regions 7, the body regions 4 and the N type layer 3 is reduced, and the triggering point of the parasitic thyristor inherently associated with the IGBT is elevated.

Figure 3:
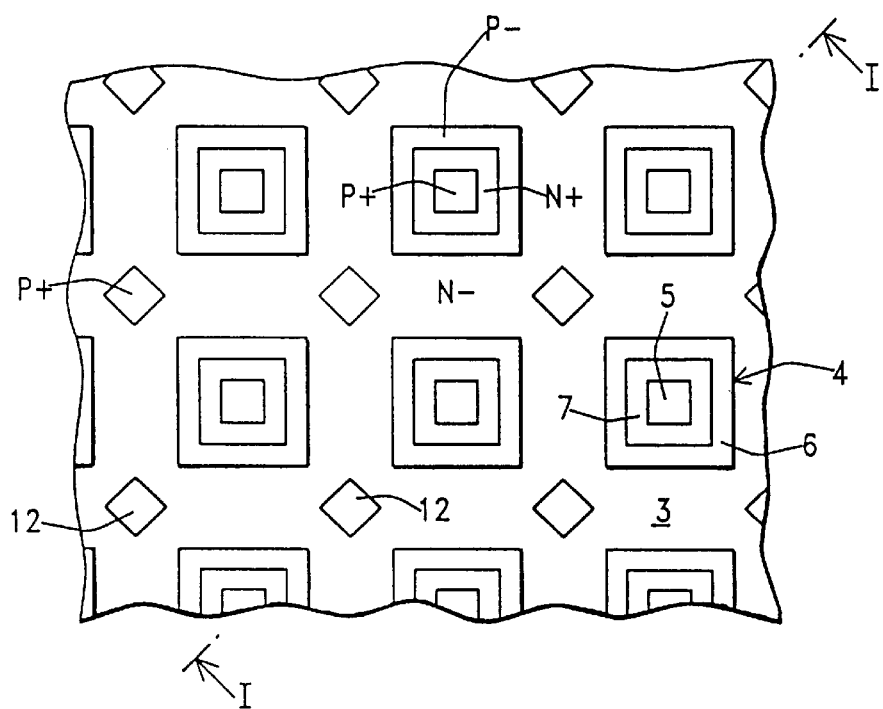
FIG. 3 is a top-plan view of a portion of an Insulated Gate Bipolar Transistor according to a first practical embodiment of the present invention.

FIG. 3 is a top-plan view at the level of the front surface of layer 3 of a portion of an IGBT having a layout according to a first embodiment of the present invention. In this embodiment, the body regions 4 have a square shape; inside each body region 4 an annular emitter region 7 is formed, defining an annular channel portion 6. The body regions 4 are arranged to form a bidimensional array in the N type layer 3. The P type regions 12 are formed in regions of the N type layer 3 comprised between the corners of four adjacent body regions 4, so that also the P type regions 12 form a bidimensional array. The cross-sectional view of FIG. 1 corresponds to a section along line I—I of FIG. 3.

It is apparent that the body regions 4 can also have shapes different from the square one, for example hexagonal.

The Insulated Gate Bipolar Transistor according to the invention can be manufactured by means of any one of the processes known in the art for manufacturing Insulated Gate Bipolar Transistors: it is simply necessary to provide a step for the formation of the P type regions 12. Such a step need not be a dedicated additional step: regions 12 can be advantageously formed simultaneously with the heavily doped portions 5 of the body regions 4.

Figure 4:
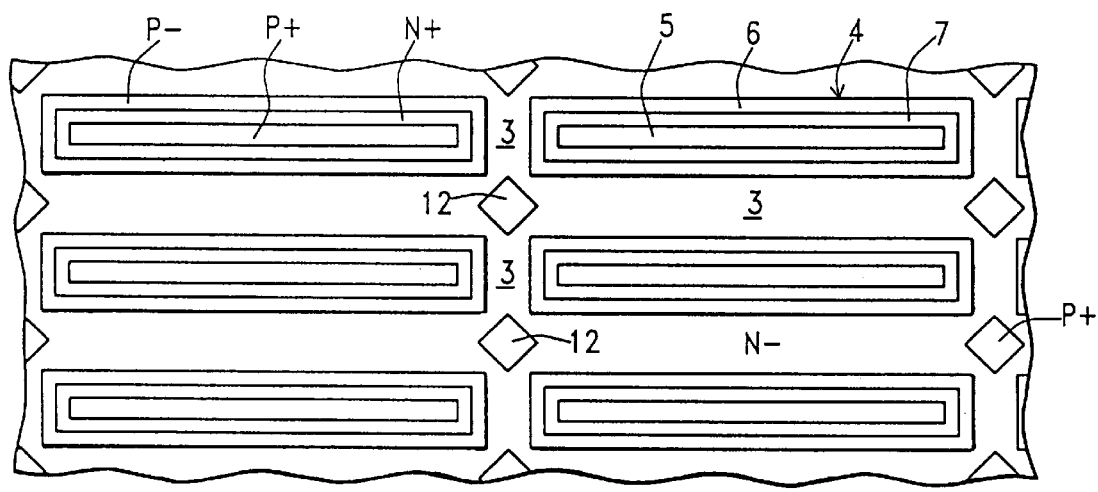
FIG. 4 is a top-plan view of a portion of an Insulated Gate Bipolar Transistor according to a second practical embodiment of the present invention.

FIG. 4 is a top-plan view similar to that of FIG. 3, and shows a portion of an IGBT having a layout according to a second embodiment of the present invention. In this embodiment, the body regions 4 are elongated, substantially rectangular stripes; inside each elongated body region 4 an elongated, annular emitter region 7 is formed, defining an elongated annular channel portion 6. FIG. 4 is actually not in scale, because normally the body regions have a longitudinal dimension much larger than the transversal dimension. As in the case of FIG. 3, the body regions 4 are arranged in a bidimensional array, and the P type region 12 are formed in regions of the N type layer 3 comprised between the corners of four adjacent body regions 4.

Figure 5:
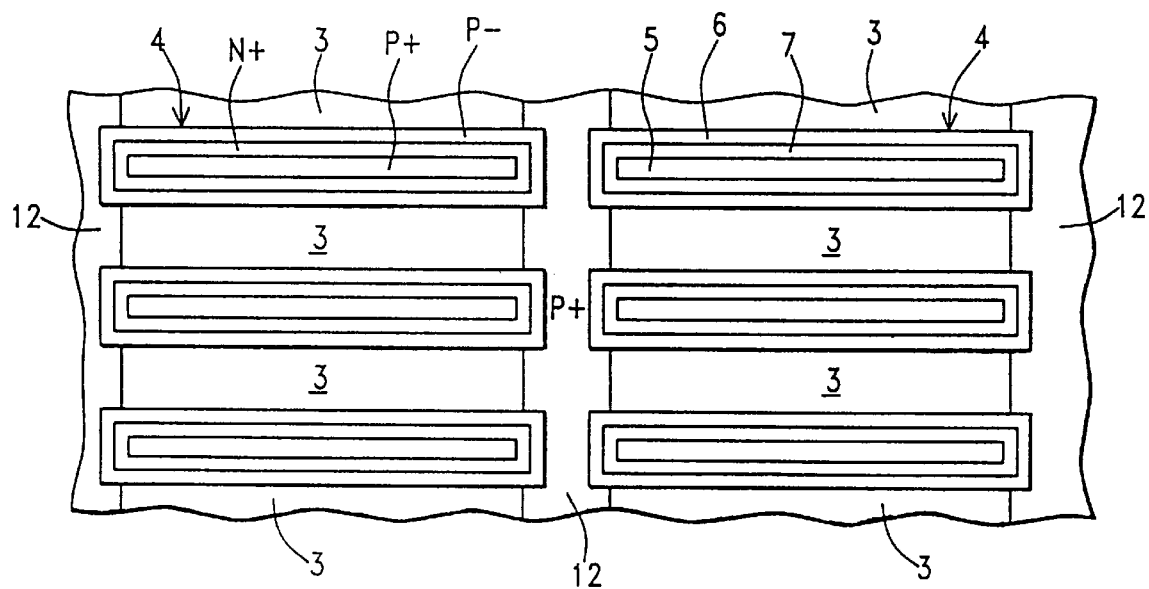
FIG. 5 is a top-plan view of a portion of an Insulated Gate Bipolar Transistor according to a third practical embodiment of the present invention.

FIG. 5 is a top-plan view similar to that of FIG. 4, and shows a portion of an IGBT having a layout according to a third embodiment of the present invention. In this embodiment the body regions 4 have a shape similar to that shown in FIG. 4. However, differently from the embodiment of FIG. 4, the P type regions 12 have the form of elongated stripes extending orthogonally to the body stripes 4 in the portions of the N type layer 3 comprised between the body stripes 4; additionally, the body stripes are preferably merged at their ends with the P type stripes 12.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Insulated Gate Bipolar Transistor comprising a semiconductor substrate of a first conductivity type forming a first electrode of the device, a semiconductor layer of a second conductivity type superimposed over said substrate, a plurality of body regions of the first conductivity type formed in the semiconductor layer, a first doped region of the second conductivity type formed inside each body region, an insulated gate layer superimposed over portions of the semiconductor layer between the body regions and forming a control electrode of the device, a conductive layer insulatively disposed over the insulated gate layer and contacting each body region and each doped region formed therein, the conductive layer forming a second electrode of the device, wherein in said portions of the semiconductor layer between the body regions second doped regions of the first conductivity type are formed, and openings are provided in the insulated gate layer at said second doped regions to allow the conductive layer to contact the second doped regions;

wherein said body regions are elongated stripes having two elongated sides and two short sides, and are arranged in a bidimensional array, said second doped regions being elongated stripes formed in portions of the semiconductor layer comprised between the body regions and extending perpendicularly to the elongated sides of the body regions.

2. Insulated Gate Bipolar Transistor according to claim 1, wherein said body regions have a polygonal layout and are arranged in a bidimensional array, said second doped regions being formed in portions of the semiconductor layer comprised between groups of four adjacent body regions.

3. Insulated Gate Bipolar Transistor according to claim 1, wherein said body regions are elongated stripes and are arranged in a bidimensional array, said second doped regions being formed in portions of the semiconductor layer comprised between groups of four adjacent body regions.

4. Insulated Gate Bipolar Transistor according to claim 1, wherein the body regions are merged, at their short sides, with the second doped regions.

5. Insulated Gate Bipolar Transistor according to claim 1, wherein between the semiconductor substrate and the semiconductor layer a heavily doped layer of the second conductivity type is provided.

6. Insulated Gate Bipolar Transistor according to claim 1, wherein said first conductivity type is P type, and said second conductivity type is N type.

7. Insulated Gate Bipolar Transistor according to claim 1, wherein said first conductivity type is N type, and said second conductivity type is P type.

8. An insulated gate bipolar transistor comprising:
a semiconductor substrate of a first conductivity type forming a first electrode of the device;
a semiconductor layer of a second conductivity type superimposed over said substrate;
a plurality of body regions of the first conductivity type formed in said semiconductor layer;
a first doped region of the second conductivity type formed in each body region;
an insulated gate layer superimposed over portions of the semiconductor layer and body regions and forming a control electrode of the device;
a conductive layer insulatively disposed over the insulated gate layer, contacting each body region and doped region, and forming a second electrode of the device; and second doped regions of the first conductivity type formed in said semiconductor layer between body regions and contacting said conductive layer;
wherein said body regions are elongated stripes having two elongated sides and two short sides, and are arranged in a bidimensional array, said second doped regions being elongated stripes formed in portions of the semiconductor layer comprised between the body regions and extending perpendicularly to the elongated sides of the body regions.

9. An insulated gate according to claim 8, wherein said body regions have a polygonal layout and are arranged in a bidimensional array, said second doped regions being formed in portions of the semiconductor layer comprised between groups of four adjacent body regions.

10. An insulated gate according to claim 8, wherein said body regions are elongated stripes and are arranged in a bidimensional array, said second doped regions being formed in portions of the semiconductor layer comprised between groups of four adjacent body regions.

11. An insulated gate according to claim 8, wherein the body regions are merged, at their short sides, with the second doped regions.

12. An insulated gate according to claim 8, wherein between the semiconductor substrate and the semiconductor layer a heavily doped layer of the second conductivity type is provided.

13. An insulated gate according to claim 8, wherein said first conductivity type is P type, and said second conductivity type is N type.

14. An insulated gate according to claim 8, wherein said first conductivity type is N type, and said second conductivity type is P type.

15. An insulated gate according to claim 8 wherein each body region comprises a central heavily doped portion surrounded by a more lightly doped channel portion.

16. An insulated gate according to claim 8 wherein said insulated gate layer comprises a gate oxide layer and a conductive gate layer.

17. An insulated gate according to claim 8 wherein openings are provided in the insulating gate layer at said second doped regions to allow the conductive layer to contact the second doped regions.

18. An insulated gate bipolar transistor comprising:
a semiconductor substrate of a first conductivity type forming a first electrode of the device;
a semiconductor layer of a second conductivity type superimposed over said substrate;
a plurality of body regions of the first conductivity type formed in said semiconductor layer;
a first doped region of the second conductivity type formed in each body region;
an insulated gate layer superimposed over portions of the semiconductor layer and body regions and forming a control electrode of the device;
a conductive layer insulatively disposed over the insulated gate layer, contacting each body region and doped region, and forming a second electrode of the device; and second doped region means of the first conductivity type formed in said semiconductor layer between body regions;
wherein said second doped region means contacts said conductive layer; and
wherein said body regions are elongated stripes having two elongated sides and two short sides, and are arranged in a bidimensional array, said second doped region means being elongated stripes formed in portions of the semiconductor layer comprised between the body regions and extending perpendicularly to the elongated sides of the body regions.

19. An insulated gate according to claim 18, wherein said body regions have a polygonal layout and are arranged in a bidimensional array, said second doped region means being formed in portions of the semiconductor layer comprised between groups of four adjacent body regions.

20. An insulated gate according to claim 18, wherein said body regions are elongated stripes and are arranged in a bidimensional array, said second doped region means being formed in portions of the semiconductor layer comprised between groups of four adjacent body regions.

21. An insulated gate according to claim 18, wherein the body regions are merged, at their short sides, with the second doped regions.

22. An insulated gate according to claim 18, wherein between the semiconductor substrate and the semiconductor layer a heavily doped layer of the second conductivity type is provided.

23. An insulated gate according to claim 18, wherein said first conductivity type is P type, and said second conductivity type is N type.

24. An insulated gate according to claim 18, wherein said first conductivity type is N type, and said second conductivity type is P type.

* * * * *